Feb. 17, 1970 R. E. RUTHENBERG ET AL 3,496,415

SEMICONDUCTOR DEVICE BURNOUT PROTECTION CIRCUIT

Filed Feb. 6, 1967 2 Sheets-Sheet 1

Inventors
ROSS E. RUTHENBERG
LUCIEN C. WINHAM
BY Mueller, Aichele & Rauner
ATTYS.

SEMICONDUCTOR DEVICE BURNOUT PROTECTION CIRCUIT

Filed Feb. 6, 1967

Inventors
ROSS E. RUTHENBERG
LUCIEN C. WINHAM
BY Mueller, Aichele & Rauner
ATTYS.

United States Patent Office 3,496,415
Patented Feb. 17, 1970

3,496,415

SEMICONDUCTOR DEVICE BURNOUT PROTECTION CIRCUIT

Ross E. Ruthenberg, Blue Island, Ill., and Lucien C. Winham, Tempe, Ariz., assignors to Motorola Inc., Franklin Park, Ill., a corporation of Illinois Filed Feb. 6, 1967, Ser. No. 614,111
Int. Cl. H02h 3/00, 7/00, 9/00
U.S. Cl. 317—16 11 Claims

ABSTRACT OF THE DISCLOSURE

A protection circuit coupling a power supply to the semiconductor device to be protected. The circuit operates by reducing the power supplied to the semiconductor device to prevent destruction of the transistor by excessive current flow therethrough. The current through the transistor is permitted to enter the destructive current range before the power reduction takes place.

Cross reference

This application is related to Patent No. 3,448,342 of Paul H. Jacobs.

Background

It has been found that most semiconductor device failures occur when a condition arises during operation which causes localized heating of a small area of a semiconductor chip. This localized heating is due to power dissipation at the particular point and can be attributed to the nonuniformity of the chip, that is, flaws, diffusion differences or other non-uniformities. The result is that localized thermal runaway occurs causing the destruction of the chip at that point. This thermal runaway is characterized by a rapid increase in the DC current demanded by the semiconductor device, the rate of rise being limited to a large degree by the power supply impedance.

Semiconductor devices such as power transistors used in electronic devices, are often operated as close to their maximum ratings as possible, in order to obtain the maximum possible power output from the transistor. This is particularly true in mobile equipment where the size of the equipment and power supply is limited. Many types of transistor protection circuits, for example, current limiters, restricted tuning range, and feedback circuits, embody the principle of preventing potentially dangerous operating conditions from arising. This necessitates tightly controlled circuit design and device specifications. Since devices, such as current limiters, operate in the saturated mode, they do not operate rapidly enough to prevent damage to circuit transistors once the current through the transistors reaches the destructive range. Further, when parallel RF power transistors are supplied by a single limiter protection circuit, failure of one transistor may occur since this transistor may be supplied with currents in the destructive range of current while the total currents supplied to the transistors is still below the limiting level. Thus, the transistors must be operated below their maximum capabilities or the risk of certain number of failures must be accepted.

Summary

It is, therefore, an object of this invention to provide an improved semiconductor device protection circuit.

Another object of this invention is to provide a semiconductor device protection circuit wherein the current through the transistor is permitted to rise to the destructive range before protective action takes place.

Another object of this invention is to provide a semiconductor device protection circuit for preventing burn-action is initiated as a function of the rate of increase of current and not the total magnitude of the current.

Another object of this invention is to provide a semiconductor device protection circuit for preventing burnout of a plurality of parallel connected tranistors.

In practicing this invention a semiconductor device protection circuit is provided coupling the power supply to the semiconductor device to be protected. In one embodiment of the protection circuit, a pair of conductors connects a power supply to a transistor, which is to be protected, with an impedance inserted in series with one of the conductors. The current through the impedance is measured to operate the protection circuit. In another embodiment operation of the protection circuit requires a negligible supply voltage or current.

With the impedance being a resistor, the operation of the transistor burnout protection circuit is initiated when the current through the resistor reaches a magnitude within a range of currents destructive to the transistor. When the current through the resistor reaches this magnitude a protection circuit operates to reduce the power supplied to the transistor. This protective action may be carried out by use of an SCR coupled across the two conductors to effectively "short" the conductors. Current limiting means are coupled in series with the SCR to prevent damage to the SCR. The SCR can be triggered directly by the current through the resistance or it can be triggered by a fast acting tunnel diode trigger circuit.

An inductance may be substituted for the resistance in which case the circuit operates when there is a sharp increase in current through the inductance, a characteristic which occurs when the currents through the transistor reach the destructive range. A transistor may also be inserted in series with one of the conductors and coupled to the SCR for control thereby. The action of the SCR upon being triggered acts to increase the resistance of the series transistor to reduce the current supplied to the transistor being protected.

The invention is illustrated in the drawings in which.

Description

Figures 1, 2, 3:
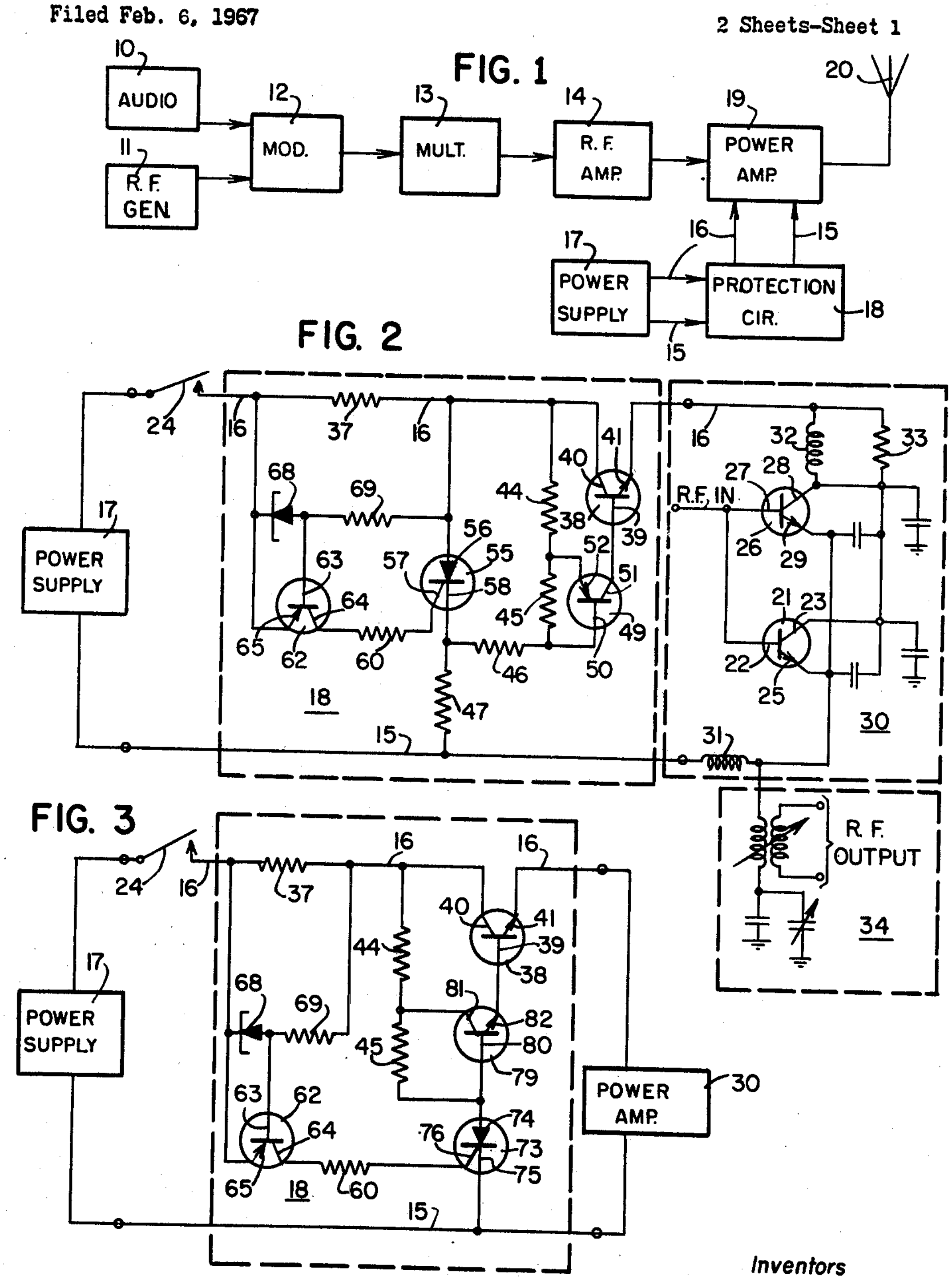
FIG. 1 is a block diagram of a radio transmitter incorporating the protection circuit of this invention.
FIG. 2 is a partial block diagram and partial schematic of one embodiment of the protective circuit of this invention.
FIG. 3 is a partial schematic and partial block diagram of a variation of the circuit of FIG. 2.

In FIG. 1 there is shown a block diagram of a radio transmitter incorporating the protection circuit of this invention. A radio frequency generator 11 provides a radio frequency signal which is coupled to modulator 12. Audio circuit 10 develops an audio signal which is coupled to modulator 12 to modulate the radio frequency signal. The modulated radio frequency signal is multiplied and amplified in multiplier 13 and further amplified in RF amplifier 14. The output of RF amplifier 14 is coupled to power amplifier 19 for further amplification and the output of power amplifier 19 is coupled to antenna 20 or radiation thereby. Power supply 17 is coupled to power amplifier 19 through protection circuit 18 by conductors 15 and 16.

The power transistors in power amplifier 19 are operated as near their maximum rating as possible in order to achieve the maximum power output possible from the transmitter. Thus the normal operating current range is from zero to the maximum allowable current. In mobile equipment, antenna 20 may be placed at various locations and as a result transients can occur which are transmitted from antenna 20 back to power amplifier 19. In additon antenna 20 may pick up signals from nearby stations which are coupled to the output of transistors of power amplifier 19 to add to the voltages at the transistor or load circuits to which the transistors of power amplifier 19 are coupled may be mistuned. These factors may cause currents in the destructive range, that is, currents geater in magnitude than the normal operating currents, to flow through the transistor.

It has been discovered that the currents through semiconductor devices may be permitted to enter the destructive current range provided in the power supplied to the semiconductor device is reduced rapidly after the current enters this range. By permitting the currents to enter the destructive range, the protective action does not operate until it is absolutely necessary for it to do so in order to prevent burnout of the transistor.

Referring to FIG. 2 there is shown the power supply 17 coupled to a portion of power amplifier 19 by the conductors 15 and 16 and protection circuit 18. Power amplifier 19 is represented by power transistor circuit 30. While two transistors coupled in parallel are shown in this circuit any number of transistors, including a single transistor, coupled in a known manner may be used in the power amplifier circuit. The RF input is coupled to bases 22 and 27 of transistors 21 and 26 and the output is coupled from emitters 25 and 29 to the antenna 20 of FIG. 1 (not shown in FIG. 2) through coupling circuit 34. Power supply 17 is coupled to transistors 21 and 26 by conductor 15 and inductance 31, and by conductor 16, inductance 32 and resistor 33.

In operation, with switch 24 closed, current flows from the power supply through resistance 37 and conductor 16, transistor 38, inductance 32 and resistance 33 to collectors 23 and 28 of transistors 21 and 26, and returns through inductance 31 and conductor 15. The load current flowing through resistor 37 causes a voltage drop to appear across the resistor. This voltage drop is coupled across resistor 69 and tunnel diode 68 coupled in series. With the current through resistor 37 in the normal operating range the voltage drop across resistor 37 is low and a very small current flows through the series circuit of tunnel diode 68 and resistor 69. This small current causes a small voltage drop across tunnel diode 68 and thus a small voltage between base 63 and emitter 65 of transistor 62, biasing transistor 62 to non-conduction. With transistor 62 biased to non-conduction, SCR 55 is also non-conducting.

Current flows through resistors 44 and 45 and base 50 to emitter 52 of transistor 49 to bias transistor 49 to conduction. Transistor 49 conducting provides a base current to base 39 of transistor 38 biasing transistor 38 to conduction thus permitting current to flow from collector 40 to emitter 41 of transistor 38 to power amplifier circuit 30.

As the current through resistance 37 increases, the voltage across this resistor increases. Since the current increases very rapidly as the transistor starts to undergo thermal runaway and burnout the circuit is not operative until the current through resistor 37 reaches a destructive range which is greater in magnitude than the normal operating range. The destructive range is also spaced apart from the normal operating range of current thus small excursions of current above the normal operating range will not cause the protection circuit to operate.

When the current through resistor 37 reaches a preset value within the destructive range the current through resistor 69 and diode 68 reaches the peak point value of tunnel diode 68 and the tunnel diode switches to its "on" mode. At this point the voltage across tunnel diode 68 rapidly increases to a higher level biasing transistor 62 to conduction. Current flows from emitter 65 through collector 64 and resistor 60 to control electrode 57 of SCR 55 and turns on SCR 55. With SCR biased to conduction, current flows from anode 56 to cathode 58 through resistor 47 increasing the potential applied through resistor 46 to base 50 of transistor 49. Under these conditions transistor 49 is biased to non-conduction cutting off the supply of base current to transistor 38. This causes transistor 38 to be biased to non-conduction and the power supplied to power amplifier 30 is cutoff.

In FIG. 3 there is shown another embodiment of a circuit of FIG. 2 in which identical components have the same reference numerals. Anode 74 of SCR 73 is coupled directly to base 80 of transistor 79 and cathode 75 is coupled to conductor 15. The circuit of FIG. 3 operates in a manner similar to that of the circuit of FIG. 2. When the current across resistor 37 reaches a preset value transistor 62 is biased to conduction causing the voltage applied to control electrode 76 of SCR 73 to bias SCR 73 to conduction. With SCR 73 biased to conduction the potential on base 80 of transistor 79 is reduced to a low value cuting off transistor 79 which in turn causes transistor 38 to be cutoff. With transistor 38 cutoff the power supplied to power amplifier 30 is cutoff.

Figure 4:
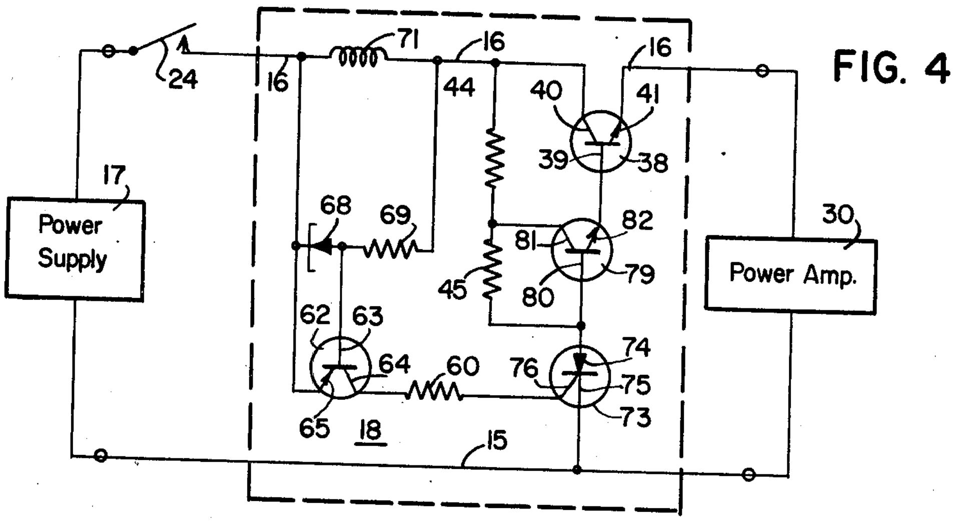
FIG. 4 is a partial schematic and partial block diagram of the circuit of FIG. 3 using an inductance for measuring current.

In FIG. 4 there is shown another embodiment of this invention similar to that shown in FIG. 3. Identical components have the same reference numerals. In the circuit of FIG. 4 resistor 37 of FIG. 3 has been replaced by inductance 71. Inductance 71 does not sense the absolute magnitude of the current to power amplifier 30 but the rate of increase of current supplied. Since the rates of change of current are low for currents in the normal operating range, the voltage across inductance 71 will below and no protective action will take place. When the current through power amplifier 30 reaches the destructive range the current rapidly increases and a relatively large voltage will be developed across inductance 71. This large voltage acts to initiate the protective action as described in connection with the circuit of FIG. 3. The rapid increase occurs and is detected even if the current through only one transistor reaches the destructive range while the total current supplied is in the normal operating range. Thus, the circuit of FIG. 4 acts to protect a plurality of transistors operating in parallel where a current limiter would not provide this protection.

Figure 5:
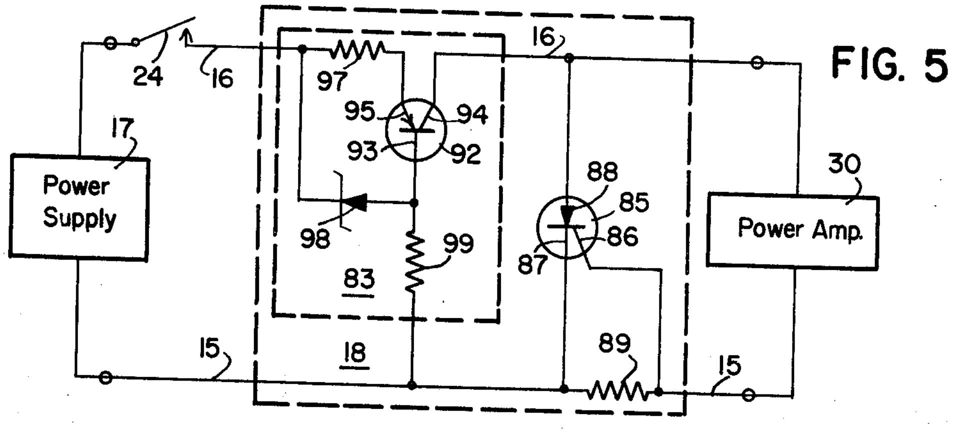
FIG. 5 is a partial schematic and partial block diagram of another embodiment of the protection circuit of this invention.

In FIG. 5 there is shown another embodiment of this invention. A particular advantage of this configuration is that it requires negligible voltage or current from the power supply. With switch 24 closed, power is supplied from power supply 17 through conductors 15 and 16 to power amplifier 30. Limiter 83 is coupled in series with conductor 16 with the base electrode 93 of transistor 92 being coupled to conductor 15 through resistor 99 to provide a reference voltage. In normal operation transistor 92 is biased to conduction and current flows through emitter 95 and collector 94 to power amplifier 30. Resister 99 and Zener diode 98 clamp base 93 of transistor 92 at a particular reference voltage. As the current flowing through resistor 97 increase, the voltage at emitter 95 is reduced causing transistor 92 to be biased toward non-conduction. However, it should be noted that values of Zener diode 98 and resistors 97 and 99 are chosen so that this limiting action does not occur within the normal operating current range of power amplifier 30.

As the current flowing through power amplifier 30 increases to a point where it is in the destructive range, the voltage drop across resistor 89 becomes sufficient to bias SCR 85 to conduction. With SCR biased to conduction it is coupled across power amplifier 30 and effectively shorts out the power amplifier and the voltage applied thereto is reduced to zero. In order to protect SCR 25 and power supply 17, the limiting action of current limiter 83 acts to restrict the flow of current through SCR 85 under these conditions. Thus, limiter 83 acts only to protect the SCR and the power supply from damage due to the short circuiting of power amplifier 30.

Figure 6:
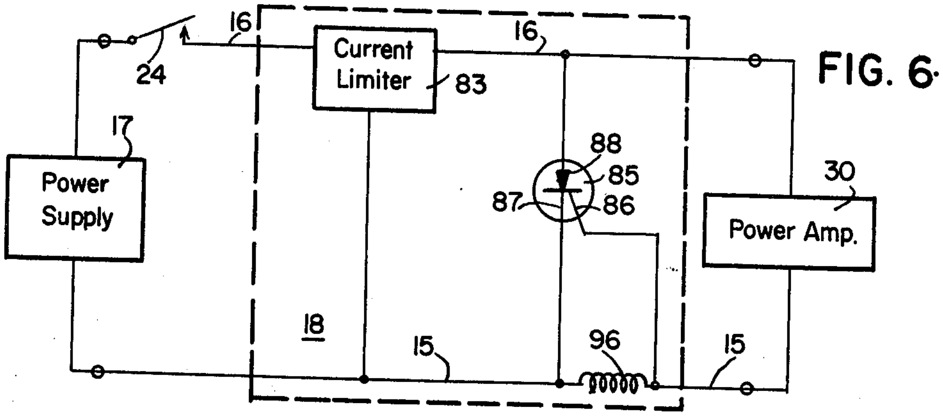
FIG. 6 is a partial schematic and partial block diagram of the circuit of FIG. 5 using an inductance for measuring current.

In FIG. 6 there is shown another embodiment of the circuit of FIG. 5 in which resistor 89 is replaced by inductance 96. As previously described in connection with the embodiment of FIG. 4, the voltage drop across inductance 96 is dependent only upon the rate of increase of the current supplied to power amplifier 30. When the current through power amplifier 30 enters the destructive range a rapid rise in current flow through inductance 96 takes place and the voltage across inductance 96 is sufficient to trigger SCR 85.

Thus, a transistor burnout protection circuit has been described in which current flow through a transistor is permitted to enter the destructive range before control action takes place to reduce the power supplied to the transistor. This permits the transistor to be operated very close to its maximum rating without continuously being subject to limiting action protective devices until it is absolutely required to prevent damage to the transistor. Furthermore, FIGS. 5 and 6 show a technique whereby said protection is achieved while requiring negligible voltage and current from the power supply during normal operation. The protective circuit is also operative to detect the potential burnout of a single transistor of a group of parallel connected transistors when the total current supplied to the transistors is within the normal operating range.

What is claimed is:

1. A protection circuit, including in combination, a semiconductor device, a power supply, first and second conductor means coupling the semiconductor device to said power supply, said power supply providing a range of normal operating currents to said semiconductor device, said range of normal operating currents increasing to a range of destructive currents having a greater magnitude than said range of normal operating currents in response to a malfunction of the semiconductor device, said first conductor means including an inductance coupled in series therewith whereby said normal and destructive ranges of currents flow therethrough, current regulating means for controlling the current supplied to the semiconductor device and including an SCR coupled between said first and second conductor means, said SCR further having a control electrode coupled to said inductance, said inductance being responsive to said currents in said destructive current range to develop a control voltage, said SCR being responsive to said control voltage to become conductive whereby current flows from said first conductor means to said second conductor means through said SCR, said current regulating means being responsive to said flow of current through said SCR to reduce the current supplied to said semiconductor device.

2. The protection circuit of claim 1 wherein, said semiconductor device includes power transistor means, said current regulating means further includes resistance means and tunnel diode means series connected across said inductance, control transistor means having an input electrode and a control electrode coupled across said tunnel diode means and an output electrode coupled to said control electrode of said SCR, said inductance being responsive to said currents in said destructive current range to change the voltage between said control and input electrodes of said control transistor means to render said control transistor means conductive to supply said control voltage to said SCR, said SCR being responsive to said control voltage to become conductive whereby current flows from said first conductor means to said second conductor means through said SCR.

3. The protection circuit of claim 1 wherein said power transistor means includes a plurality of transistors coupled in parallel.

4. The protection circuit of claim 2 wherein said current regulating means includes regulating transistor means series connected with one of said first and second conductor means whereby said normal operating and destructive ranges of current flow through said regulating transistor means, said regulating transistor means including a control electrode coupled to said SCR, said conduction of said SCR acting to reduce the drive current to said regulating transistor means whereby the conductance of said regulating transistor means is reduced.

5. The protection circuit of claim 4 wherein, said SCR includes an anode electrode coupled to said first conductor means and a cathode electrode coupled to said second conductor means, first, second and third resistors series connected between said first conductor means and said cathode electrode of said SCR, said regulating transistor means includes a first transistor having an input electrode coupled to said inductance, an output electrode coupled to said power transistor means and a control electrode, a second transistor having an input electrode coupled to the junction of said first and second resistors, an output electrode coupled to said control electrode of said first transistor and a control electrode coupled to the junction of said second and third resistors.

6. The protection circuit of claim 4 wherein, said SCR includes a cathode electrode coupled to said second conductor means and an anode electrode, first and second resistors series connected between said first conductor means and said anode electrode of said SCR, said regulating transistor means includes a first transistor having an input electrode coupled to said inductance, an output electrode coupled to said power transistor means and a control electrode, a second transistor having an input electrode coupled to the junction of said first and second resistors, an output electrode coupled to said control electrode of said first transistor and a control electrode coupled to said anode electrode of said SCR.

7. The protection circuit of claim 1 wherein said current regulating means further includes current limiter means coupled in series with one of said conductors whereby said current flowing through said SCR flows through said current limiter means, said SCR having an anode coupled to said second conductor means and cathode and control electrodes coupled across said inductance.

8. A transistor protection circuit, including in combination, transistor amplifier means having first and second terminals for receiving operating power, a power supply, an SCR having an anode electrode coupled to said first terminal, a control electrode coupled to said second terminal and a cathode electrode, inductive impedance means connected between said cathode and control electrodes and further coupling said cathode electrode to said second terminal whereby said anode-cathode electrodes of said SCR are coupled in parallel with said transistor amplifier means, first circuit means coupling said power supply to said first terminal and said anode electrode, second circuit means coupling said power supply to said inductive impedance means and said cathode electrode whereby said inductive impedance means is coupled in series with said transistor amplifier means and said power supply, one of said first and second circuit means including current limiting means for limiting the current supplied from said power supply to said SCR.

9. The protection circuit of claim 8 wherein, said power transistor means includes a plurality of power transistors coupled in parallel.

10. A protection circuit, including in combination, a semiconductor device, a power supply, first and second conductor means coupling the semiconductor device to said power supply, said power supply providing a range of normal operating currents to said semiconductor device, said range of normal operating currents increasing to a range of destructive currents having a greater magnitude and greater rate of current increase than said range of normal operating currents in response to a malfunction of the semiconductor device, one of said first and second conductor means including an inductance coupled in series therewith whereby said normal and destructive ranges of currents flow therethrough, current regulating means for controlling the current supplied to the semiconductor device, said inductance being responsive to said currents in said destructive current range to develop a control voltage, said current regulating means being responsive to said control voltage to reduce the current supplied to said semiconductor device.

11. The protection circuit of claim 10 wherein, said current regulating means includes an SCR coupled between said first and second conductor means and across said inductance, said SCR being responsive to said control voltage to become conductive, said current regulating means being responsive to said conductive SCR to reduce the current supplied to said semiconductor device.

References Cited

UNITED STATES PATENTS

| | | | |
|---|---|---|---|
| 3,204,174 | 8/1965 | Clerc | 323—22 |
| 3,364,392 | 1/1968 | Lafreniere | 317—33 |
| 3,373,341 | 3/1968 | Wattson | 323—9 |

LEE T. HIX, Primary Examiner

J. D. TRAMMELL, Assistant Examiner

U.S. Cl. X.R.

317—20, 33